US006492625B1

(12) United States Patent
Boguslavskiy et al.

(10) Patent No.: US 6,492,625 B1
(45) Date of Patent: Dec. 10, 2002

(54) APPARATUS AND METHOD FOR CONTROLLING TEMPERATURE UNIFORMITY OF SUBSTRATES

(75) Inventors: Vadim Boguslavskiy, Princeton; Alexander Gurary, Bridgewater; Ameesh Patel, Roseland; Jeffrey Ramer, Flemington, all of NJ (US)

(73) Assignee: Emcore Corporation, Somerset, NJ (US)

(*) Notice: Subject to any disclaimer, the term of this patent is extended or adjusted under 35 U.S.C. 154(b) by 43 days.

(21) Appl. No.: 09/671,527

(22) Filed: Sep. 27, 2000

(51) Int. Cl.⁷ .................................................. H05B 1/02
(52) U.S. Cl. ...................... 219/486; 219/497; 219/483; 219/486; 374/121; 118/725
(58) Field of Search .................. 219/483–486, 219/497, 121.43, 121.41, 121.47; 118/724, 725; 156/345; 392/416; 374/121, 137

(56) References Cited

U.S. PATENT DOCUMENTS

| 4,859,832 A | 8/1989 | Uehara et al. ............... 219/411 |
| 4,919,542 A | 4/1990 | Nulman et al. ................ 374/9 |
| 4,956,538 A | 9/1990 | Moslehi .................... 219/121.6 |
| 5,061,084 A * | 10/1991 | Thompson et al. ......... 374/127 |
| 5,114,242 A | 5/1992 | Gat et al. .................... 374/128 |
| 5,156,461 A | 10/1992 | Moslehi ...................... 374/121 |
| 5,271,084 A | 12/1993 | Vandenabeele et al. ..... 392/416 |
| 5,291,514 A | 3/1994 | Heitmann et al. .......... 373/135 |
| 5,294,778 A | 3/1994 | Carman et al. ............. 219/385 |
| 5,305,417 A | 4/1994 | Najm et al. ................. 392/416 |
| 5,436,172 A | 7/1995 | Moslehi ......................... 437/8 |
| 5,442,727 A | 8/1995 | Fiory .......................... 392/416 |
| 5,444,815 A | 8/1995 | Lee et al. |
| 5,446,824 A | 8/1995 | Moslehi |
| 5,536,918 A | 7/1996 | Ohkase et al. ............... 219/390 |
| 5,624,590 A | 4/1997 | Fiory .......................... 219/390 |
| 5,635,409 A | 6/1997 | Moslehi ......................... 438/7 |
| 5,660,472 A | 8/1997 | Peuse et al. ................. 374/128 |
| 5,755,511 A | 5/1998 | Peuse et al. ................. 374/128 |
| 5,790,750 A | 8/1998 | Anderson .................... 392/416 |
| 5,874,711 A | 2/1999 | Champetier et al. ........ 219/497 |
| 5,881,208 A | 3/1999 | Geyling et al. ............. 392/418 |
| 5,895,596 A | 4/1999 | Stoddard et al. |
| 5,930,456 A | 7/1999 | Vosen |
| 5,958,140 A | 9/1999 | Arami et al. |
| 6,184,498 B1 * | 2/2001 | Kiyama ....................... 219/390 |
| 6,211,495 B1 * | 4/2001 | Stoddard et al. ............ 219/497 |
| 6,225,601 B1 * | 5/2001 | Beer et al. ................... 219/390 |
| 6,259,072 B1 * | 7/2001 | Kinnard et al. ............. 219/486 |

* cited by examiner

*Primary Examiner*—Mark Paschall
(74) *Attorney, Agent, or Firm*—Lerner, David, Littenberg, Krumholz & Mentlik, LLP

(57) ABSTRACT

An apparatus and method for providing substantially uniform substrate temperature in a chemical vapor deposition reaction chamber is provided. The method and apparatus utilize a carrier for holding at least one substrate in the reaction chamber and a plurality of heating elements arranged to heat the carrier and the at least one substrate. At least one substrate pyrometer measures the temperature of the substrates to provide a signal representing the process temperature. This signal is used in a feedback loop to control one or more of the heating elements. At least two carrier pyrometers focused at different zones of the carrier are provided. The signals from the carrier pyrometers are compared to one another to provide an indication of temperature non-uniformity. This indication is used in a separate feedback loop to adjust other heating elements so as to maintain temperature uniformity across the carrier.

18 Claims, 4 Drawing Sheets

APPARATUS AND METHOD FOR CONTROLLING TEMPERATURE UNIFORMITY OF SUBSTRATES

FIELD OF THE INVENTION

The present invention relates to measurement and control of substrate temperature. More particularly, the present invention relates to an apparatus and method for controlling the temperature uniformity of a substrate during deposition of a coating thereon.

BACKGROUND OF THE INVENTION

Various industries employ processes to form a thin layer or film on a solid substrate. For example, the production of semiconductor devices utilizes chemical vapor deposition and other deposition techniques to deposit a variety of materials on a substrate. During production of semiconductor devices, heated substrates, such as planar silicon or gallium arsenide wafers or other suitable materials, are exposed to gases which react to deposit the desired materials on the surface of the wafer. Typically, the deposited materials form epitaxial films which replicate the crystal lattice structure of the underlying wafer.

These coated wafers are then subjected to well known further processes to form semiconductor devices such as lasers, transistors, light emitting diodes, and a variety of other devices. For example, in the production of light emitting diodes, the layers deposited on the wafer form the active elements of the diodes. The thickness, composition and quality of the deposited layers determine the characteristics of the resulting semiconductor devices. Accordingly, the deposition process must be capable of depositing films of uniform composition and thickness on the front face of each wafer. The requirements for uniformity have become progressively more stringent with the use of larger diameter wafers and with the use of apparatus which deposits coatings on several wafers simultaneously.

In a typical prior art deposition apparatus illustrated in FIG. 1, a wafer 10 is mounted in a wafer carrier 12 which, in turn, is mounted on a susceptor 14. The susceptor 14 may be mounted on a rotating support spindle 16, which enables rotation of the wafer carrier. The susceptor 14, the wafer carrier 12 and the wafer 10 typically are located in an enclosed process reactor 18. A heating assembly 20 symmetrically arranged below susceptor 14 heats the susceptor, which thus results in the heating of wafer carrier 12 and wafer 10 mounted thereon. Rotation of the carrier 12 is intended to enhance the temperature uniformity across the deposition area, as well as the uniformity of the source material gases or vapors flowing over the deposition area. As is known in the art, reactants are introduced into the reaction chamber and a film is deposited on the surface of the wafer.

Conventional wafer carriers, such as wafer carrier 12 shown in FIG. 2, include multiple cylindrical pockets 22 on their upper surface for holding the wafers in place as the wafer carrier is rotated during the deposition process. These wafer carriers ordinarily also include an annular flange 24 which is used for lifting and transporting the wafer carrier into and out from the reaction chamber. On their bottom surface, the wafer carriers may include an annular wall 26 for locating and holding the wafer carrier concentrically on the susceptor as the assembly is rotated during the deposition process, and for creating a gap 28 between the upper surface of the susceptor and the lower surface of the wafer carrier, which gap eliminates localized heating of the wafer carrier resulting from points of contact between the wafer carrier and the susceptor, and thus enhances the uniform transfer of heat from the susceptor to the wafer carrier.

It is important that the temperature of the wafer is accurately measured and controlled in a manner that is repeatable, precise and independent of process conditions. It is also important to maintain a uniform temperature over the surface of the wafers being processed, and across the surface of each wafer. Deviation from target process temperatures and wafer temperature non-uniformity of only a few degrees centigrade may result in defects in the devices fabricated from the wafers and rejection of the finished product. The temperature of the wafer surface during processing is typically measured using a pyrometer. A pyrometer is a non-contact measurement device that detects radiation emitted from a surface.

The accuracy of temperature measurement by a pyrometer is highly dependent on surface optical properties, particularly emissivity of the body being measured. Emissivity is a parameter that compares radiation from an actual surface versus the radiation from a "black body" or ideal radiating body at the same temperature. Pyrometers are calibrated using a black body radiation source. Emissivity values of semiconductor wafers depend on the materials deposited on the semiconductor wafer, substrate doping, surface roughness, and wafer temperature. Emissivity also depends on the thickness of the film grown on the surface of the wafer, and this emissivity value changes during the deposition process. Accordingly, measurement of semiconductor wafer temperature desirably involves the use of emissivity compensated pyrometers, which are designed to overcome the measurement error caused by wafer emissivity variations.

A need exists for a system which provides a more uniform temperature distribution across the surface of the wafers, such that a more uniform coating can be deposited across the entire surface of each wafer.

SUMMARY OF INVENTION

The present invention provides a method and apparatus for controlled heating of a substrate. One aspect of the invention includes an apparatus for heating a substrate in a chemical vapor deposition reaction chamber. The apparatus includes a carrier for holding at least one substrate in the reaction chamber, and the carrier includes a first zone and a second zone. The carrier typically has a central axis, and the first and second zone are simply regions of the carrier disposed at different radial distances from the central axis. A rotational drive may be provided for rotating the carrier about the central axis.

The apparatus also desirably includes first and second heating elements arranged to heat the carrier and the at least one substrate. The first heating element is preferably arranged to heat the first zone preferentially, i.e., to apply heat principally to the first zone of the carrier. The apparatus preferably further includes at least one substrate pyrometer directed at a substrate surface for measuring a process temperature. The substrate pyrometers desirably are emissivity-compensated pyrometers so that the process temperature measurement represents substrate temperature independent of substrate emissivity. The apparatus desirably further includes at least two carrier pyrometers, each such carrier pyrometer being associated with one zone of the carrier surface. The at least two carrier pyrometers preferably are non-emissivity compensated pyrometers. Each carrier pyrometer is operative to provide a zone signal representing radiation from the associated zone of the carrier.

Most preferably, the apparatus includes a first comparator connected to the first and second carrier pyrometers. The first comparator is arranged to provide a first difference signal representing the difference between the first and second zone signals. Most preferably, one or more controllers are constructed and arranged to control the operation of the second heating element based at least in part on the process temperature. The controllers also may control the operation of the first heating element based at least in part upon the first difference signal.

Most preferably, the one or more controllers provide separate feedback loops so that the second heating element is controlled based upon the process temperature without reference to the difference signal, whereas the first heating element is controlled based upon the difference signal without reference to the process temperature. The emissivity of the carrier surface is unknown and typically changes during the process. Because the carrier surface typically has diffuse reflectivity, an emissivity-compensated pyrometer cannot be used to correct for emissivity of the carrier. Thus, the zone signals from the carrier pyrometers do not normally provide accurate measurements of the carrier temperature. However, because the emissivity of the carrier surface normally is the same in both zones of the carrier, the difference signal provided by the comparator represents the difference in temperature between the two zones. By minimizing the difference signal, the system assures temperature uniformity across both zones of the carrier, which in turn enhances temperature uniformity of the substrates.

More than two zones can be used. For example, the first zone may be disposed radially inward of the second zone, and the carrier may have a third zone disposed radially outward of the second zone. The apparatus may include a third carrier pyrometer operative to provide a third zone signal which represents radiation from the third zone of the carrier. A second comparator may be arranged to provide a second difference signal representing a difference between the second and third zone signals. The one or more controllers are operative to control the third heating element based at least in part on the second difference signal.

Another aspect of the invention includes a method of controlling the temperature of a substrate in a chemical vapor deposition apparatus. The method according to this aspect of the invention desirably includes providing a carrier for supporting the substrate in the chemical vapor deposition apparatus. At least one heating element is used to heat the substrate and the carrier to a process setpoint. According to one aspect of the invention, the temperature of the substrate is measured, preferably using an emissivity compensated pyrometer. Indications of a parameter related to carrier temperature are obtained from at least two zones on the carrier. For example, the indications of such parameter may represent radiation intensity from the two zones, measured by non-emissivity compensated parameters. The indications of such parameter in the at least two zones are then compared with one another to obtain a difference signal which is related to the difference in temperature between the two zones. Heat transfer to at least one of the zones of the carrier is adjusted, as, for example by adjusting power input to one or more heating elements, until the difference signal reaches a preselected level. Typically, this preselected level is substantially equal to zero, so that the two zones will settle at the same temperature.

Additional features and advantages of the invention will be set forth in the description which follows. It is to be understood that both the foregoing general description and the following detailed description are exemplary and are intended to provide further explanation of the invention as claimed.

DETAILED DESCRIPTION

Figure 1:
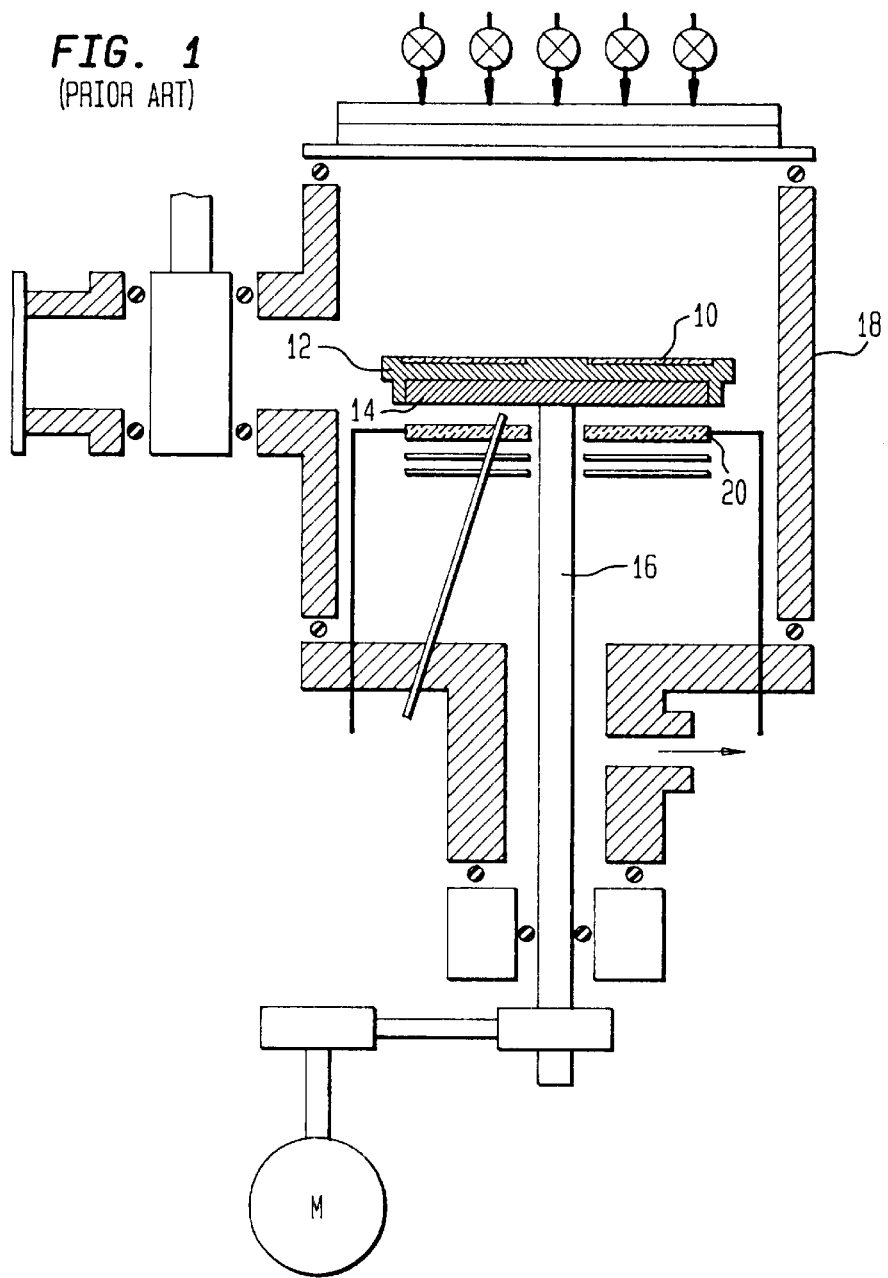
FIG. 1 is a schematic front cross-sectional view of a coating apparatus of the prior art.
Figure 2:
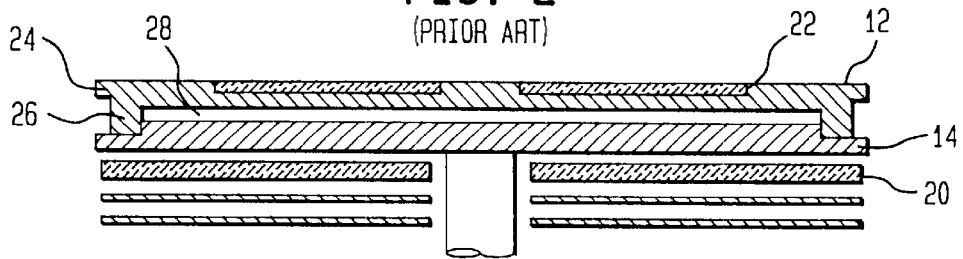
FIG. 2 is a schematic front cross-sectional view of a wafer carrier of the prior art showing wafers mounted therein, a susceptor, a support spindle used to support the susceptor and a conventional heating arrangement for heating the susceptor.
Figure 3:
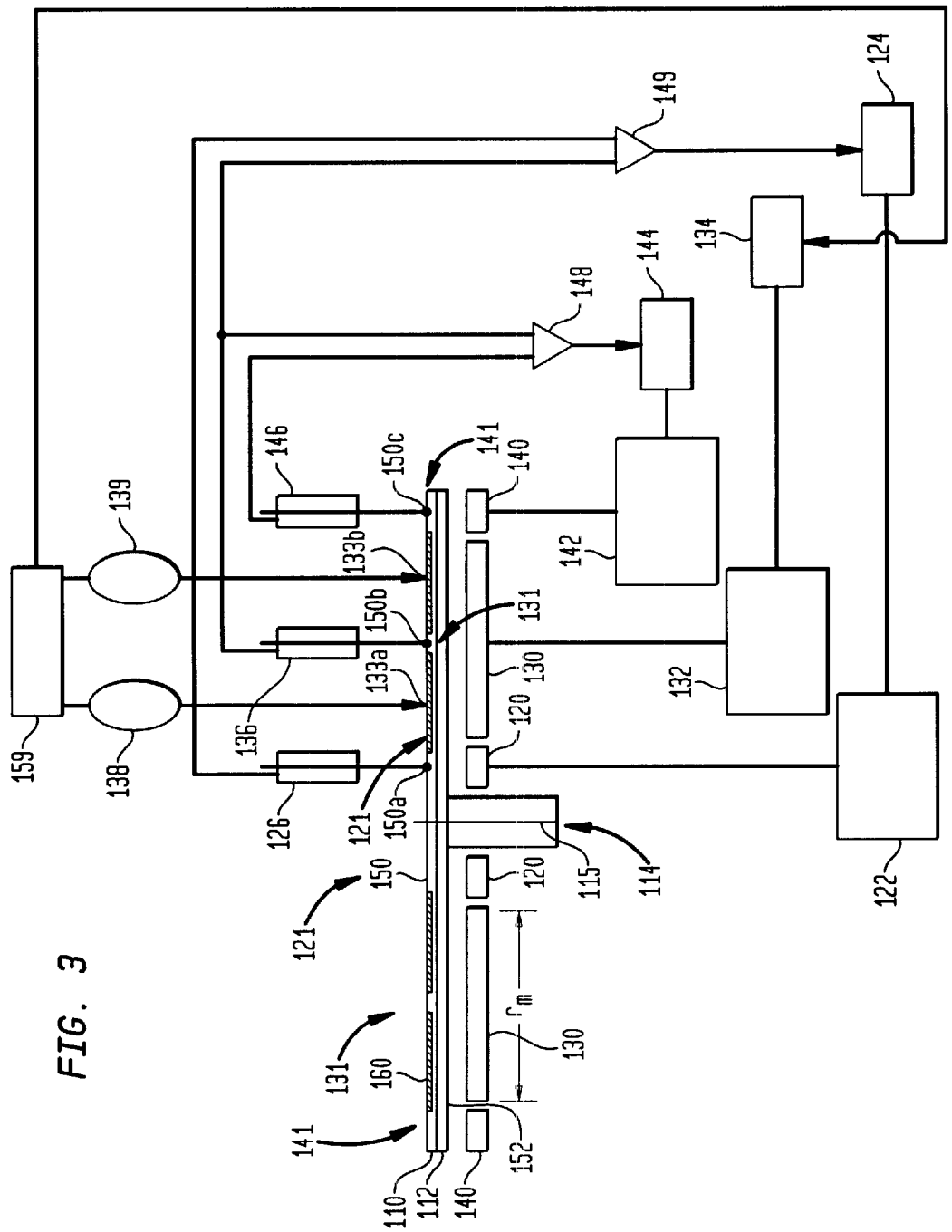
FIG. 3 is a schematic and front cross-sectional view of one embodiment of the apparatus of the present invention.

Reference will now be made in detail to the present preferred embodiment of the invention, an example of which is illustrated in the accompanying drawings. One preferred embodiment of the apparatus of the present invention is shown in FIG. 3. As illustrated, a substrate carrier 110 is positioned in an assembled relationship on a susceptor 112, which is mounted on a spindle 114 for rotation around a central axis 115.

Figure 4:
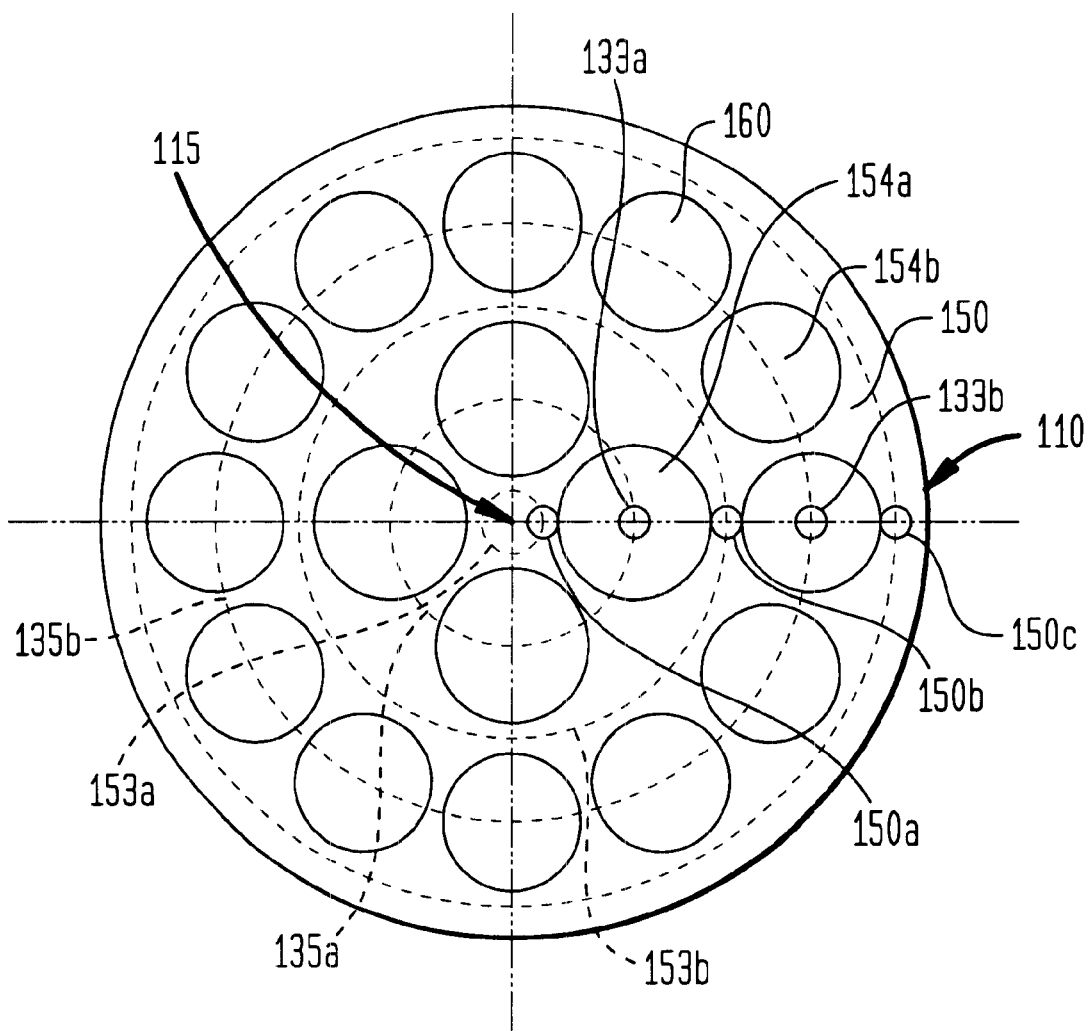
FIG. 4 is a top plan view of a wafer carrier used in the embodiment of FIG. 1.

The substrate carrier 110 may be formed from a refractory material, such as, for example, molybdenum, graphite, or silicon-carbide coated graphite, in the form of a generally disc-shaped body having an upper surface 150 and a lower surface 152. Upper surface 150 generally extends in a plane and includes a plurality of cylindrical cavities or pockets 154, each of which is sized to receive substrates 160. Referring now to FIG. 4, substrate carrier 110 is shown to include sixteen cavities or pockets 154, which hold sixteen substrates 160, which may be, for example, semiconductor wafers.

Pockets 154 are disposed in an inner ring of four pockets 154a adjacent axis 115 and an outer ring of ten pockets 154b encircling the inner ring. It will be understood, however, that the carrier may be designed to hold as few as one and as many as forty or more substrates.

A first heating element 120 is disposed beneath a first or radially inner zone 121 of the carrier so that heat from the first heating element is preferentially directed to the inner zone of the carrier. That is, heat applied by inner heating element 120 is concentrated in inner zone 121 of the carrier, although heat emitted by the inner heating element will also influence the temperature of other zones of the carrier to some extent. A second or middle heating element 130 is disposed beneath a second or middle zone 131 radially outward of zone 121, so that element 130 preferentially heats the middle zone. Similarly, a third or outer heating element 140 is disposed preferably beneath a third or outer zone 141 of the carrier, radially outward of zone 131, so that heating element 140 preferentially heats the outer zone.

Heating elements 120, 130 and 140 preferably are symmetrical about axis 115. The heating elements may be conventional resistive electric heating devices. The middle heating element 130 desirably is more powerful than the other heating elements. Also, the radial span $r_m$ of the middle heating element desirably is greater than the corresponding dimension of the other heating elements. Heating element 120 is connected to a first or inner power supply 122, which in turn is connected to a first or inner controller 124 so that controller 124 can regulate the power applied by power supply 122 and thus regulate the heat emitted by element 120. Similarly, heating element 130 is connected to a second or middle power supply 132 which in turn is connected to a second or middle controller 134. Outer heating element 140 is connected to a third or outer power supply 142, which in turn is connected to a third or outer controller 144.

The apparatus further includes a first or inner carrier pyrometer 126, a second or middle carrier pyrometer 136 and a third or outer carrier pyrometer 146. The carrier pyrometers are non-emissivity compensated pyrometers. Thus, each carrier pyrometer provides a signal which represents radiation impinging on that pyrometer. Carrier pyrometer 126 is arranged to receive radiation from a focal spot 150a at a fixed location relative to the reaction chamber. The focal spot falls on the upper surface 150 of carrier 110, within the first or inner zone 121 of the carrier. As best appreciated with reference to FIG. 4, rotation of carrier 110 about axis 115 will cause the focal spot 150a to sweep along a path 153a on the upper surface of the carrier, within inner zone 121. Path 153a is concentric with axis 115, and lies inside of the inner ring of pockets 150a. Thus, regardless of the rotational position of the carrier, focal spot 150a will always fall on the carrier top surface, and not on a substrate contained within a pocket. Thus, the inner carrier pyrometer 126 provides a signal, referred to herein as the first or inner zone signal, which represents radiation emitted from the upper surface 150 of the carrier within the inner zone 121.

The second or middle carrier pyrometer 136 receives radiation from a focal spot 150b which sweeps along a path 153b in the middle zone 131, between the inner ring of pockets 154a and the outer ring of pockets 154b. Thus, the second pyrometer 136 provides a second zone signal representing radiation emitted by the upper surface of the carrier in the second or middle zone 131. In the same way, the third or outer pyrometer 146 detects radiation from a focal spot 150c which sweeps along the outer surface in the third or outer zone 141, outboard of the outer pockets 154b. Thus, pyrometer 146 provides a third zone signal representing radiation emitted by the third or outer zone of the carrier.

The zone signals provided by carrier pyrometers 126, 136 and 146 do not accurately represent the actual temperature of the carrier in the various zones. The radiation from each zone of the carrier is a function of the emissivity of the carrier surface, as well as the temperature. The carrier is made from a material having an unknown emissivity, which changes over each use of the deposition apparatus due to the fact that various materials may be deposited on the carrier surface. Moreover, the emissivity of the carrier surface varies with temperature. However, the relationship between emissivity and temperature of the carrier will be substantially the same over the entire upper surface of the carrier. Thus, if two locations on the carrier surface are emitting radiation at the same intensity, they are at the same temperature. Moreover, intensity of the emitted radiation varies monotonically with temperature, at least within the range of temperatures used in chemical vapor deposition. Thus, if a first part of the carrier surface is emitting radiation at a higher intensity than a second part of the surface, the first part is at a higher temperature. Therefore, while the zone signals provided by the carrier pyrometers do not provide absolute temperature measurements for the various zones, these signals constitute indications of a parameter— radiation from the carrier surface—which is related to temperature.

The signal outputs of the first or inner carrier pyrometer 126 and the second or middle carrier pyrometer 136 are connected to input connections of a first comparator 149 which provides a first difference signal at its output. This first difference signal represents the difference between the first zone signal from comparator 126 and the second zone signal from pyrometer 136. The magnitude of the first difference signal is proportional to the magnitude of the difference between the zone signals, whereas the sign of the first difference signal indicates which zone signal is higher. The output of first comparator 149 is connected to first or inner controller 124, so that the first difference signal will be provided to the first controller. The signal outputs of the second or middle carrier pyrometer 136 and the third or outer carrier pyrometer 146 are connected to input connections of a second comparator 148 so that the second comparator will provide a second difference signal representing the difference between the third or outer zone signal from pyrometer 146 and the second or middle zone signal from pyrometer 136. The output of the second comparator is connected to an input of the third or outer controller 144.

The apparatus also includes two substrate pyrometers 138 and 139, which are emissivity compensated pyrometers. The term "emissivity compensated pyrometer" refers to a conventional instrument which is arranged to measure radiation from a body and which is also arranged to measure a parameter of the body which is related to the emissivity of the body so that the instrument provides a signal representing the temperature of the body with good accuracy regardless of variations in the emissivity of the body. For example, an emissivity-compensated pyrometer may include a radiation-emitting element such as a laser aimed at the body to be measured and a detector for determining the proportion of radiation from the laser which is reflected by the body, in addition to conventional elements for measuring radiation emitted by the body. Typical emissivity-compensated pyrometers only provide accurate temperature readings for bodies having specular reflectivity.

Substrate pyrometer 138 is arranged to monitor the temperature at a spot 133a. As the carrier rotates about axis 115, this spot sweeps across the upper surface of carrier 110, along a path 135a which intercepts pockets 154a. Thus, while spot 133a is aligned with a pocket as shown in FIG. 4, the pyrometer measures the temperature of the substrate 160 disposed in the pocket. The substrates generally have surfaces with specular reflectivity, and the emissivity and temperature of the substrate surface can be accurately measured. At other rotational positions of the carrier, spot 133a is aligned with the surface of the carrier itself between pockets. Because the carrier surface has diffuse reflectivity, pyrometer 138 does not accurately measure the temperature of the carrier surface. Preferably, pyrometer 138 is temporarily disabled in these rotational positions, so that it provides a signal which represents only the temperature of the substrates 160. For example, the apparatus may include devices (not shown) which detect the rotational position of the carrier and/or spindle 114 and momentarily interrupt signal output from the pyrometer at those rotational positions where spot 133a is aligned with a location between pockets 154a.

The other substrate pyrometer 139 measures the temperature at a spot 133b which sweeps along a path 135b intercepting pockets 154b. Pyrometer 139 operates in the same way as pyrometer 138, but provides a signal representing the temperature of substrates 160 contained in pockets 154b.

The substrate pyrometers 138 and 139 are connected to a signal processing circuit 159 which is arranged to average the signals from these pyrometers to provide a signal representing the average substrate temperature. The average substrate temperature is also referred to as the process temperature. The output of signal processing circuit 159 is connected to an input of the second or middle controller 134.

In operation, in a method according to one embodiment of the invention, the wafer carrier 110 is loaded with substrates 160. The second or middle controller 134 compares the average substrate temperature or process temperature communicated by signal processing circuit 159 to a setpoint to derive an error signal, and provide a correction signal to the second or middle power supply, 132. The transfer function of the controller desirably is a proportional-integral-derivative or "PID" control function, in which the correction signal is a composite of a term proportional to the error signal, a term proportional to the integral of the error signal over time and a term proportional to the first derivative of the error signal. Thus, the middle controller 134 adjusts the power applied by the middle power supply 132 if there is a difference between the process setpoint and the average process temperature. For example, if the process temperature is below the setpoint, the controller 134 will signal the power supply 132 to increase the power to the middle heating element 130 until the process temperature is approximately equal to the process setpoint.

The third or outer controller 144 compares the second difference signal from comparator 148 to a preselected level representing the desired difference signal. Normally, where it is desired to maintain the third or outer zone 131 of the carrier at the same temperature as the second or middle zone 121, this preselected level is zero. The third or outer controller provides a control signal, desirably using a PID transfer function similar to that discussed above. This control signal causes the third or outer power supply 142 to increase or decrease power to the outer heating element 140.

For example, if the sign of the second difference signal from comparator 148 indicates that the outer carrier pyrometer 146 is detecting more radiation than the middle carrier pyrometer 136, and thus indicates that the third or outer zone 141 of the carrier is hotter than the second or middle zone, the third or outer controller 144 will signal the outer power supply 142 to decrease the power output to the outer heating element 140 until the difference signal reaches the preselected level. Assuming that the preselected level is zero, reaching this level indicates that the zone signals from the second or middle carrier pyrometer 136 and from the third or outer carrier pyrometer 146 are substantially equivalent, and hence indicates that zones 131 and 141 of the carrier are at the same temperature. Of course, if the difference signal from comparator 148 initially indicates that the third or outer pyrometer 146 is detecting less radiation than the second or middle pyrometer 136, controller 144 will signal power supply 142 to increase the power applied to the third or outer heating element 142, thereby increasing heat transfer to zone 141.

The first or inner controller 124 works in substantially the same way as the third or outer controller 144, except that controller 124 is responsive to the first difference signal from comparator 149, and controls power supply 122 so as to control heat generation by the first or inner heating element 120 and thus control heat transfer to the first or inner zone 121. Thus, the controller 124 compares the first difference signal from comparator 149 with a preselected level, typically zero, generates an error signal based on such comparison and generates a control signal based on that error signal, desirably using a PID transfer function as discussed above. The control signal is applied to the first or inner power supply 122. If the zone signals from the middle carrier pyrometer 136 and inner carrier pyrometer 126 are different, the first difference signal from comparator 149 will cause the inner controller 124 to vary the power supplied to the inner heating element 120 until the difference between the zone signals from the inner carrier pyrometer 126 and middle carrier pyrometer 136 is reduced to the preselected level, typically zero, indicating that both of these pyrometers are receiving substantially equal radiation and hence that the temperature of the first or inner zone is substantially equivalent to the temperature of the second or outer zone. As used herein, substantially equivalent means that the difference in radiation between the two locations on the substrate surface is less than about 2%, preferably less than about 1%, and most preferably less than about 0.5%.

The apparatus and method described above thus provide precise regulation of the actual substrate (wafer) temperature by direct measurement of the substrate temperature itself using the emissivity-compensated substrate pyrometers, and maintains temperature uniformity across the carrier using measurements of radiation from the carrier, despite the fact that the carrier has a diffuse surface which makes it impractical to obtain emissivity-compensated measurements and hence makes it impractical to obtain accurate temperature measurements of the carrier.

Experimentation has indicated that by maintaining the temperature of the carrier substantially uniform across the radius of the carrier while maintaining the process temperature results in greater temperature uniformity across the surface of the substrate.

Figure 5:
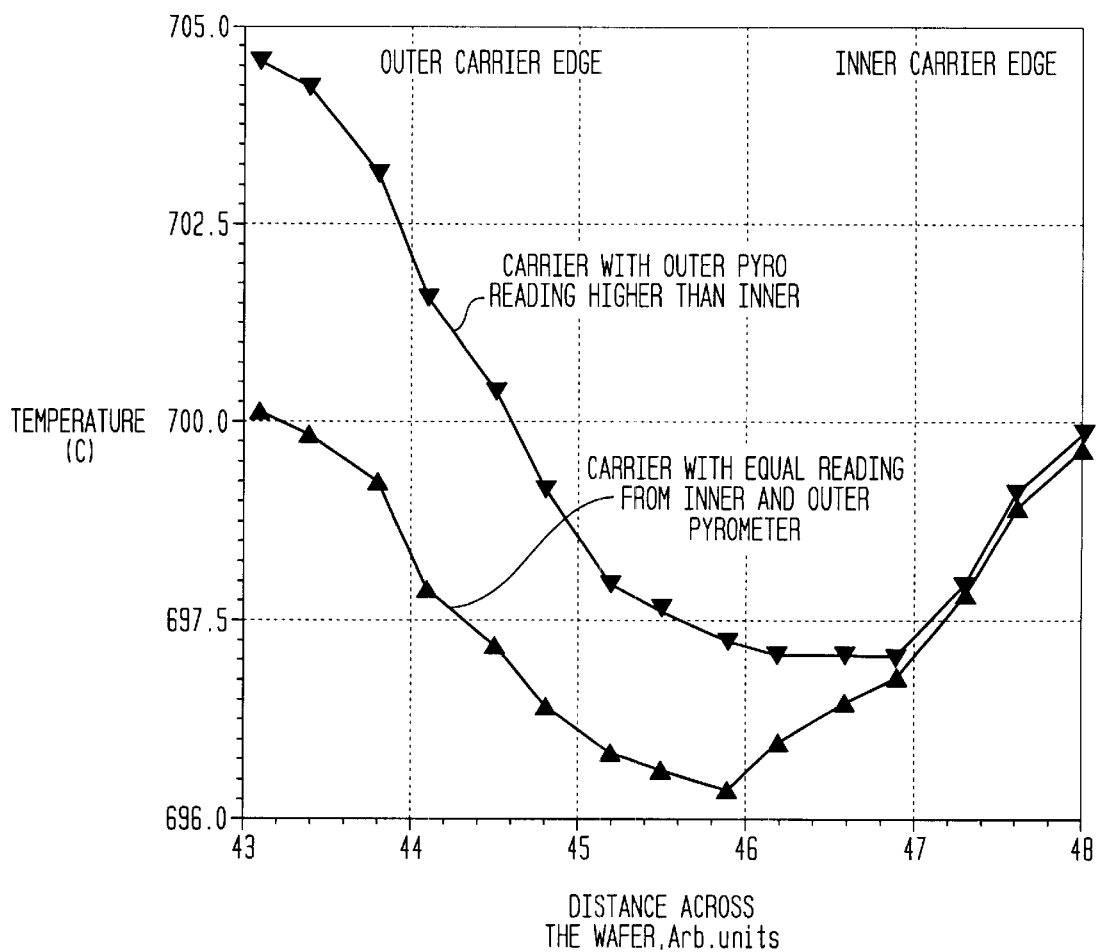
FIG. 5 is a graphical representation of experimentally obtained data showing the relationship between wafer temperature uniformity and carrier temperature uniformity.

FIG. 5 is a graphical representation showing the relation between wafer and carrier temperature uniformities. The Y-axis represents temperature in degrees centigrade and the X-axis represents the radial distance across the surface of a substrate in arbitrary units. Experimentation has shown that when the outer carrier pyrometer reading is higher than the inner pyrometer reading, as shown by the upper curve in FIG. 5, the temperature across the surface of the wafer can vary by more than 7.5° C. When the temperature of the carrier is adjusted according to the preferred embodiment of the present invention, such that the temperature indication from the inner carrier pyrometer is equal to the temperature indication from the outer carrier pyrometer, the temperature difference across the surface of the wafer is less than about 5° C.

It will be understood that the present invention is not limited to a specific number or arrangement of pyrometers, heating elements, power supplies, comparators or controllers as shown and described herein. Merely by way of example, more than three carrier pyrometers can be used to derive more than two difference signals. Conversely, the inner heating element 120 or the outer heating element 140 can be omitted, along with the carrier pyrometer, comparator, controller and power supply associated with the omitted heating element to provide a system with only two heating elements. In such a system, the middle heating element 130 is used to heat the zone of the carrier associated with the omitted heating element, and hence the carrier would have only two separately-controllable zones. In a further variant, the second or middle heating element in the embodiment discussed above is arranged to heat substantially the entire carrier nonselectively, so that this element substantially heats the first zone 121 and third zone 141 as well as the second zone 131. In this arrangement, the first heating element 120 and third heating element 140 provide additional, incremental heat localized to the first and third zones 121 and 141 to overcome additional heat losses incurred in these zones.

The comparators 148, 149, processor 159, and controllers 124, 134 and 144 are shown as functional blocks for the purposes of clarity. Those skilled in the art will understand that these elements may be implemented separately or they may be integrated with one another. For example, signal processing elements such as comparators and controllers may be implemented within a computer having a general-purpose processor and appropriate software instructions, analog-to-digital converters and digital-to-analog converters. Also, the functions of several carrier pyrometers can be implemented in a single instrument having one radiation-sensing element and having a moving mirror or other optical arrangement for moving the focal location of the instrument so that the instrument will detect radiation from different locations at different times. In this case, the device may include a sample-and-hold circuit or digital memory for holding a value representing one zone signal or radiation from one focal spot while the instrument is monitoring radiation from another focal spot to derive another zone signal. Similarly, the functions of the two substrate pyrometers can be integrated in a single instrument. In a further, less preferred variant, only one substrate pyrometer is used to obtain only one substrate temperature from a single focal spot, and this single substrate temperature is used as the process temperature.

In the preferred embodiment discussed above with reference to FIGS. 1–4, the second or middle heater is controlled solely with reference to the process temperature or average substrate temperature, whereas the first and third (inner and outer) heating elements are controlled solely with reference to the difference signals, by feedback loops entirely separate from the feedback loop used to control the second or middle heating element. However, in a variant of this approach, the feedback loops to some or all of the heaters can be based in part on the difference signals and in part on the process temperature. For example, the controller may be arranged to react to a situation where the first or inner zone is hotter than the second or middle zone, but the desired process temperature is low, by increasing power to both the first and second heating elements, but increasing the power to the first heating element less than the power to the second heating element. One arrangement which would accomplish this is to derive the control signal for the first power supply 122 by multiplying the control signal applied by the second controller 134 (responsive to the process temperature) by the sum of 1 plus the control signal applied by the first controller 124. Such complexity, however, typically is not required.

Alternative means can be utilized to regulate heat transfer to a particular zone of the carrier and thus increase or decrease the temperature of such zone. For example, the temperature of a zone can be increased by maintaining the power of the heating element associated with that zone and moving the heating element closer to the carrier. Similarly, the temperature of a zone can be decreased by increasing the distance between the zone of the carrier and the heating element. In another embodiment, the heating element associated with a particular zone can be provided as a plurality of smaller heating elements. The temperature of a zone can be increased by supplying power to more of the smaller heating elements associated with that zone, or decreased by providing power to fewer elements associated with a particular zone. In another embodiment, heating and cooling elements can be used in combination to heat and cool zones of the carrier responsive to control signals as discussed above. In still another embodiment, combinations of each of these heating and cooling arrangements can be used to increase or decrease the temperature of the particular carrier zones.

The invention can be applied with carriers other than the disc-like carrier discussed above. In one example, a generally cylindrical, drum-like carrier is rotatable about its central axis and has wafers carried on the circumferential cylindrical surface. The carrier may include multiple zones spaced axially rather than radially, and the heating elements and carrier pyrometers may be arranged accordingly.

The first and third controllers 149 and 148 discussed above compare the difference signals to a preselected level to derive an error signal. If the pyrometers all have the same properties, and if the comparators do not introduce any offset into the difference signals, setting this preselected level to zero will produce the most uniform temperature across the various zones of the carrier. However, if the pyrometers differ from one another or if the comparators introduce some offset into the difference signal, a non-zero difference signal will represent the most uniform temperature distribution. Thus, the preselected levels used by these comparators may be set to non-zero values which may be the same or different to maintain a uniform temperature distribution. Also, the preselected levels used by these comparators can be set to values other than zero to deliberately produce non-uniform temperatures in different zones of the carrier.

In the preferred embodiments discussed above, radiation intensity from the carrier is measured as a parameter which is related to temperature. The spectral composition of radiation from the carrier can be monitored instead of the radiation intensity. It is possible to practice the invention using other parameters related to temperature that can be measured in the environment of the chemical vapor deposition apparatus. For example, the electrical properties of the carrier itself, or the electrical properties of transducers mounted to the carrier, can be monitored in different zones of the carrier.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. An apparatus for controlled heating of a substrate in a chemical vapor deposition reaction chamber comprising:
   a carrier for holding at least one substrate in the reaction chamber, said carrier including a first zone and a second zone;
   first and second heating elements arranged to heat the carrier and the at least one substrate, said first heating element being arranged to heat said first zone preferentially;
   at least one substrate pyrometer for measuring a process temperature by measuring radiation from at least one of said one or more substrates; and
   a first carrier pyrometer operative to provide a first zone signal representing radiation from said first zone of the carrier and a second carrier pyrometer operative to provide a second zone signal representing radiation from said second zone of the carrier.

2. The apparatus of claim 1, further comprising a first comparator connected to said first and second carrier pyrometers, said first comparator being arranged to provide a first difference signal representing a difference between said first and second zone signals, and one or more controllers constructed and arranged to control the operation of said second heating element based at least in part upon said process temperature and to control the operation of said first heating element based at least in part upon said first difference signal.

3. The apparatus of claim 1, wherein said at least one substrate pyrometer comprises an emissivity compensated pyrometer and said carrier pyrometers comprise non-emissivity compensated pyrometers.

4. The apparatus of claim 3, wherein said carrier has a central axis, said first and second zones being disposed at different radial distances from said central axis.

5. The apparatus of claim 4, wherein said first zone is disposed radially inward of said second zone, said carrier also having a third zone disposed radially outward of said second zone, the apparatus further comprising a third carrier pyrometer operative to provide a third zone signal representing radiation from said third zone of the carrier, and a second comparator connected to said second and third carrier pyrometers said second comparator being arranged to provide a second difference signal representing a difference between said second and third zone signals, said one or more controllers being operative to control said third heating element based at least in part on said second difference signal.

6. The apparatus of claim 5, wherein said heating elements are radially spaced apart.

7. The apparatus of claim 5, further comprising a rotational drive for rotating said carrier about said axis.

8. The apparatus of claim 5, further including a first power supply for supplying power to said first heating element, a second power supply for supplying power to said second heating element and a third power supply for supplying power to said third heating element, said one or more controllers being operative to control operation of said power supplies.

9. The apparatus of claim 1, wherein said one or more controllers includes a first controller operative to control operation of said first heating element to said first difference signal but not responsive to said process temperature, and a second controller operative to control said second heating element responsive to said process temperature but not responsive to said first difference signal.

10. An apparatus for controlled heating of a substrate in a chemical vapor deposition reaction chamber comprising:
  a carrier for holding at least one substrate in the reaction chamber, said carrier including a first zone and a second zone;
  means for heating said carrier;
  means for measuring a process temperature by measuring the temperature of at least one of said one or more substrates;
  means for providing a first zone signal representing a parameter related to temperature of said first zone of the carrier and a second zone signal representing a parameter related to temperature of said second zone of the carrier; and
  means for controlling said heating means so as to maintain said process temperature at a target temperature based at least in part upon comparison of said measured process temperature with a setpoint temperature and maintain temperature uniformity between said zones of said carrier based at least in part upon comparison of said zone signals.

11. A method of controlling the temperature of a substrate in a chemical vapor deposition apparatus comprising:
  providing a carrier for supporting said substrate in said chemical vapor deposition apparatus;
  heating said carrier and said substrate;
  measuring the temperature of said substrate;
  obtaining indications of a parameter related to carrier temperature from at least two zones of said carrier;
  comparing said parameter indications from said at least two zones to obtain a difference signal; and
  adjusting heat transfer to said zones responsive to said measured temperature and said difference signal so as to maintain said measured temperature at a setpoint and so as to maintain said difference signal at a preselected level.

12. The method of claim 11, wherein said preselected level is substantially equal to zero.

13. The method of claim 12, wherein said at least one substrate has a specular surface, and said step of measuring the temperature of said substrate includes using an emissivity compensated pyrometer.

14. The method of claim 13, wherein said step of obtaining said indication of said parameter includes using at least one non-emissivity compensated pyrometer.

15. The method of claim 14, wherein said step of obtaining said indication of said parameter includes using at least two non-emissivity compensated pyrometers.

16. The method of claim 15 wherein said carrier has a diffuse surface.

17. A method of thermally processing one or more semiconductor wafers in a chemical vapor deposition apparatus comprising:
  providing a carrier supporting said one or more semiconductor wafers in said chemical vapor deposition apparatus;
  heating said one or more semiconductor wafers on said carrier to a target operating temperature;
  measuring the temperature of said semiconductor wafer using an emissivity compensated pyrometer;
  providing a difference signal related to the temperature difference between at least two zones on said carrier; and
  adjusting the temperature in one of the at least two zones of said carrier based at least in part upon said difference signal.

18. The method of claim 17, wherein said step of providing a difference signal includes monitoring radiation from said carrier using one or more non-emissivity compensated pyrometers.

* * * * *

UNITED STATES PATENT AND TRADEMARK OFFICE
CERTIFICATE OF CORRECTION

PATENT NO.    : 6,492,625 B1
DATED         : December 10, 2002
INVENTOR(S)   : Vadim Boguslavskiy et al.

It is certified that error appears in the above-identified patent and that said Letters Patent is hereby corrected as shown below:

Title page,
Item [*] Notice, should read -- Subject to any disclaimer, the term of this Patent is extended or adjusted under 35 U.S.C. 154(b) by 0 days. --.

Signed and Sealed this

Twenty-fourth Day of January, 2006

JON W. DUDAS
*Director of the United States Patent and Trademark Office*